(12) United States Patent
Kang et al.

(10) Patent No.: US 10,466,372 B2
(45) Date of Patent: Nov. 5, 2019

(54) X-RAY BEAM INTENSITY MONITORING DEVICE AND X-RAY INSPECTION

(71) Applicants: TSINGHUA UNIVERSITY, Beijing (CN); NUCTECH COMPANY LIMITED, Beijing (CN)

(72) Inventors: Kejun Kang, Beijing (CN); Shuwei Li, Beijing (CN); Qingjun Zhang, Beijing (CN); Yuanjing Li, Beijing (CN); Yulan Li, Beijing (CN); Ziran Zhao, Beijing (CN); Yinong Liu, Beijing (CN); Yaohong Liu, Beijing (CN); Weibin Zhu, Beijing (CN); Xiaolin Zhao, Beijing (CN); Huishao He, Beijing (CN)

(73) Assignees: TSINGHUA UNIVERSITY, Beijing (CN); NUCTECH COMPANY LIMITED, Beijing (CN)

( * ) Notice: Subject to any disclaimer, the term of this patent is extended or adjusted under 35 U.S.C. 154(b) by 247 days.

(21) Appl. No.: 14/981,953

(22) Filed: Dec. 29, 2015

(65) Prior Publication Data
US 2016/0187502 A1    Jun. 30, 2016

(30) Foreign Application Priority Data

Dec. 31, 2014  (CN) ........................ 2014 1 0851366
Dec. 31, 2014  (CN) ........................ 2014 1 0851416

(51) Int. Cl.
*G01T 7/00*    (2006.01)
*G01T 1/20*    (2006.01)
(Continued)

(52) U.S. Cl.
CPC .............. *G01T 7/00* (2013.01); *G01T 1/1603* (2013.01); *G01T 1/2006* (2013.01); *H01L 27/30* (2013.01);
(Continued)

(58) Field of Classification Search
CPC .. G01T 1/00; G01T 1/02; G01T 1/023; G01T 1/026; G01T 1/04; G01T 1/16;
(Continued)

(56) References Cited

U.S. PATENT DOCUMENTS 4,051,377 A    9/1977  Kemner
4,193,000 A *  3/1980  Shirayama .............. H01J 47/02
                                                      250/385.1
(Continued)

FOREIGN PATENT DOCUMENTS

CN    1595124 A    3/2005
CN    1698542 A    11/2005
(Continued)

OTHER PUBLICATIONS

European Search Report for EP 15203078 dated May 10, 2016, 6 pages.
(Continued)

*Primary Examiner* — Anastasia Midkiff
(74) *Attorney, Agent, or Firm* — Kilpatrick Townsend & Stockton LLP (57) ABSTRACT

The present invention discloses an X-ray beam intensity monitoring device and an X-ray inspection system. The X-ray beam intensity monitoring device comprises an intensity detecting module and a data processing module, wherein the intensity detecting module is adopted to be irradiated by the X-ray beam and send a detecting signal, the data processing module is coupled with the intensity detecting module to receive the detecting signal and output an X-ray beam intensity monitoring signal, wherein the X-ray beam intensity monitoring signal includes a dose monitoring signal for the X-ray beam and a brightness correction signal for correcting signal values of the X-ray beam. The X-ray beam intensity monitoring device can simultaneously per-
(Continued)

form dose monitoring and brightness monitoring, thereby improving the service efficiency of the X-ray beam intensity monitoring device. Moreover, the monitoring result of the X-ray beam intensity can be more accurate and reliable.

9 Claims, 4 Drawing Sheets (51) Int. Cl.
| | |
|---|---|
| H04N 5/57 | (2006.01) |
| G01T 1/16 | (2006.01) |
| H01L 27/30 | (2006.01) |
| H05G 1/36 | (2006.01) |
| G21K 1/02 | (2006.01) |
| G01T 1/17 | (2006.01) |
| G01V 5/00 | (2006.01) |
| H04N 5/369 | (2011.01) |
| G06T 1/00 | (2006.01) |

(52) U.S. Cl.
CPC ............. *H04N 5/57* (2013.01); *H05G 1/36* (2013.01); *G01T 1/17* (2013.01); *G01V 5/0016* (2013.01); *G06T 1/0014* (2013.01); *G09G 2320/0626* (2013.01); *G09G 2320/0646* (2013.01); *G21K 1/02* (2013.01); *H04N 5/3698* (2013.01)

(58) Field of Classification Search
CPC ....... G01T 1/1603; G01T 1/20; G01T 1/2006; G01T 1/2018; G01T 1/205; G01T 1/208; G01T 1/24; G01T 1/244; G01T 1/247; G01T 7/00; G01T 7/005; H01L 27/14; H01L 27/144; H01L 27/146; H01L 27/148; H01L 27/30; H01L 27/301; H01L 27/304; H01L 27/305; H01L 27/308; G06T 1/00; G06T 1/0014; H04N 5/30; H04N 5/32; H04N 5/335; H04N 5/351; H04N 5/369; H04N 5/3698; H04N 5/374; H04N 5/3741; H04N 5/3745; H04N 5/455; H04N 5/57; G09G 2320/06; G09G 2320/0626; G09G 2320/0633; G09G 2320/064; G09G 2320/0646; H05G 1/00; H05G 1/08; H05G 1/26; H05G 1/30; H05G 1/36

See application file for complete search history.

(56) References Cited

U.S. PATENT DOCUMENTS

| 7,091,486 B1 | 8/2006 | McCord et al. | |
|---|---|---|---|
| 2002/0064254 A1* | 5/2002 | Aoki | A61B 6/00 378/98.7 |
| 2004/0218713 A1* | 11/2004 | Hoffman | A61B 6/032 378/19 |
| 2010/0284601 A1* | 11/2010 | Rubner | A61B 6/4405 382/132 |

FOREIGN PATENT DOCUMENTS

| CN | 101261235 A | 9/2008 |
|---|---|---|
| CN | 101937092 A | 1/2011 |
| CN | 101971053 A | 2/2011 |
| CN | 104516010 A | 4/2015 |
| CN | 204439577 U | 7/2015 |
| EP | 1463932 B1 | 7/2009 |
| JP | 2000321220 A | 11/2000 |
| RU | 108859 U1 | 9/2011 |

OTHER PUBLICATIONS

Russian Office Action dated Feb. 20, 2019 in the corresponding RU application (application No. 2015156055).

* cited by examiner

X-RAY BEAM INTENSITY MONITORING DEVICE AND X-RAY INSPECTION

The present application claims the priority to Chinese Patent Applications No. 201410851366.X and 201410851416.4, both filed with the Chinese State Intellectual Property Office on Dec. 31, 2014, which are incorporated herein by reference in their entireties.

FIELD OF THE INVENTION

The present invention relates to the technical field of X-ray application, and particularly relates to an X-ray beam intensity monitoring device and an X-ray inspection system.

BACKGROUND OF THE INVENTION

In an X-ray inspection system, an X-ray emitting device is mainly an electron accelerator or an X-ray tube. The X-ray emitting device and a detector array adopted to receive X-ray are placed on both sides of an inspected object. Under normal circumstances, an X-ray beam emitted by the X-ray emitting device contains both a working beam directly irradiated on the detector array and a redundant beam irradiated on the outside of the detector array.

The X-ray beam is usually a fan-shaped beam, the fan-shaped beam is perpendicular to the ground, and the width of the working beam in the fan-shaped beam at the detector array is generally required to be approximately equal to the width of the detector array. For this reason, a collimator is often arranged between the X-ray emitting device and the detector array. The collimator is adopted to shield the redundant beam in the X-ray beam. When an object is inspected, the collimator is located between the X-ray emitting device and the inspected object.

In general, the intensity of the X-ray beam is monitored by means of dose monitoring or brightness monitoring of the X-ray beam. Dose monitoring means monitoring the dose intensity of the X-ray beam, judging whether the dose intensity exceeds a regulated dose value, and if so, and sending a dose monitoring signal to perform such operations as alarming or cutting off the power supply of the X-ray emitting device and the like. Brightness monitoring means collecting a fluctuation change value of the intensity of the X-ray beam within each measurement period and sending a brightness correction signal to correct the value collected by the detector array, so as to obtain more accurate information of the inspected object.

A dose monitoring device and a brightness monitoring device of the X-ray beam are common in the X-ray inspection system, and the two devices independently exist in the X-ray inspection system under normal conditions.

The X-ray inspection system and the X-ray beam intensity monitoring device thereof in the prior art will be illustrated below by taking it as an example that the electron accelerator is used as the X-ray emitting device of the X-ray inspection system.

The dose monitoring device in the prior art includes a detecting module, the detecting module is directly placed at the outlet of the X-ray beam of the electron accelerator in general and is located in a box body of the electron accelerator, X-rays directly penetrate through the sensitive volume of the detecting module and irradiate on the inspected object.

The monitoring method adopted by the brightness monitoring device in the prior art is to collect a brightness signal by using a redundancy detector at the upper edge region of the fan-shaped beam in the detector array for X-ray inspection and send the brightness correction signal to correct the value collected by the detector array.

In a process of implementing the present invention, the inventor of the present invention finds that the above prior art has the following disadvantages:

in the dose monitoring device in the prior art, the X-ray beam intensity is lost because of the necessity of penetrating through the sensitive volume of the detecting module, namely, the detecting sensitive volume intervenes in the X-ray beam intensity and a structure of energy spectrum arriving at the inspected object. Moreover, since the electron accelerator is a heavy current installation, while the detecting module of the dose monitoring device is a weak current instrument, the detecting module is very susceptible to electromagnetic interference of the former, and can only provide average dose information within a certain period of time in general, for example, a few seconds. In the X-ray inspection system, to ensure safety, when the dose of the X-ray beam is larger than a regulated threshold, the power supply of the X-ray emitting device must be cut off as soon as possible, thus the dose monitoring device is required to be reliable and accurate in measurement, but the dose monitoring device in the above prior art is difficult to satisfy this requirement.

In the brightness monitoring device in the prior art, the redundancy detector of the detector array is susceptible to interference of a reflected signal, mechanical deformation and other factors of the inspected object. Moreover, when the X-ray emitting device is the electron accelerator, the X-ray beam intensity on the "main beam" direction (i.e., the direction of the electron beam) of the X-ray beam is large, the larger the included angle of a position with the "main beam" is, the weaker the X-ray beam intensity is, and the X-ray beam intensity of the region where the redundancy detector is located is generally weak, so that the monitoring result is affected ultimately.

SUMMARY OF THE INVENTION

The purpose of the present invention is to provide an X-ray beam intensity monitoring device and an X-ray inspection system, which can improve the service efficiency of the X-ray beam intensity monitoring device. The other purpose of the present invention is to provide an X-ray inspection system, and the monitoring result of X-ray beam intensity of the X-ray inspection system is more accurate and reliable.

A first aspect of the present invention provides an X-ray beam intensity monitoring device, including an intensity detecting module and a data processing module, and the intensity detecting module is adopted to be irradiated by the X-ray beam and send a detecting signal, the data processing module is coupled with the intensity detecting module to receive the detecting signal and output an X-ray beam intensity monitoring signal, and the X-ray beam intensity monitoring signal includes a dose monitoring signal for the X-ray beam and a brightness correction signal for correcting signal values of the detector array.

Further, the X-ray beam intensity monitoring device includes a plurality of intensity detecting modules, and the plurality of intensity detecting modules are coupled with the same data processing module.

Further, the intensity detecting modules are independently sealed respectively.

Further, the data processing module includes an integrating amplifier and a signal conversion device, the integrating amplifier is coupled with the intensity detecting module to receive the detecting signal and output a voltage signal, and the signal conversion device is coupled with the integrating amplifier to receive the voltage signal and output the dose monitoring signal and the brightness correction signal.

Further, the signal conversion device includes a voltage comparator and an analog-digital converter, the voltage comparator is coupled with the integrating amplifier to receive the voltage signal and output a level signal to serve as the dose monitoring signal, and the analog-digital converter is coupled with the integrating amplifier to receive the voltage signal and output a digital signal to serve as the brightness correction signal.

Further, the intensity detecting module is a scintillation detecting module or a gas detecting module.

Further, the intensity detecting module is a scintillation detecting module, the scintillation detecting module includes a scintillator, a photosensor and a shielding layer, one end of the scintillator is coupled with the photosensor, and the shielding layer is arranged on the periphery of the photosensor.

A second aspect of the present invention provides an X-ray inspection system, including an X-ray emitting device, a detector array and an X-ray beam intensity monitoring device, and the X-ray beam intensity monitoring device is the X-ray beam intensity monitoring device in any item in the first aspect of the present invention.

Further, an X-ray beam emitted by the X-ray emitting device includes a working beam irradiated on the detector array and a redundant beam irradiated on the outside of the detector array, and the intensity detecting module of the X-ray beam intensity monitoring device is arranged between the X-ray emitting device and the detector array such that the intensity detecting module will be irradiated by the redundant beam and send the detecting signal.

Further, the X-ray inspection system further includes a collimator, and the intensity detecting module is located between the X-ray emitting device and the collimator.

According to the X-ray beam intensity monitoring device and the X-ray inspection system provided by the first and second aspect of the present invention, the X-ray beam intensity monitoring device includes the intensity detecting module and the data processing module, the intensity detecting module is adopted to be irradiated by the X-ray beam and send the detecting signal, the data processing module is coupled with the intensity detecting module to receive the detecting signal and output the X-ray beam intensity monitoring signal, and the X-ray beam intensity monitoring signal includes the dose monitoring signal and the brightness correction signal, so that the X-ray beam intensity monitoring device can simultaneously perform dose monitoring and brightness monitoring, which improves the service efficiency of the X-ray beam intensity monitoring device.

A third aspect of the present invention provides an X-ray inspection system, including an X-ray emitting device, a detector array and an X-ray beam intensity monitoring device, and an X-ray beam emitted by the X-ray emitting device includes a working beam irradiated on the detector array and a redundant beam irradiated on the outside of the detector array, and the X-ray beam intensity monitoring device includes an intensity detecting module and a data processing module, and the intensity detecting module is arranged between the X-ray emitting device and the detector array such that the intensity detecting module will be irradiated by the redundant beam and send a detecting signal, and the data processing module is coupled with the intensity detecting module to receive the detecting signal and output an X-ray beam intensity monitoring signal.

Further, the X-ray inspection system further includes a collimator located between the X-ray emitting device and the detector array, and the intensity detecting module is located between the X-ray emitting device and the collimator.

Further, the X-ray beam intensity monitoring device includes a plurality of intensity detecting modules which are symmetrically arranged relative to the working beam.

Further, the X-ray beam is a fan-shaped beam, and the intensity detecting module is located at a side of the fan-shaped beam.

Further, the X-ray beam intensity monitoring signal includes a dose monitoring signal for the X-ray beam and/or a brightness correction signal for correcting signal values of the detector array.

Further, the data processing module includes an integrating amplifier and a signal conversion device, the integrating amplifier is coupled with the intensity detecting module to receive the detecting signal and output a voltage signal, and the signal conversion device is coupled with the integrating amplifier to receive the voltage signal and output the X-ray beam intensity monitoring signal.

Further, the signal conversion device includes at least one of a voltage comparator and an analog-digital converter, and the voltage comparator is coupled with the integrating amplifier to receive the voltage signal and output a level signal to serve as the dose monitoring signal, and the analog-digital converter is coupled with the integrating amplifier to receive the voltage signal and output a digital signal to serve as the brightness correction signal.

Further, the intensity detecting module is a scintillation detecting module or a gas detecting module.

Further, the intensity detecting module is a scintillation detecting module, the scintillation detecting module includes a scintillator, a photosensor and a shielding layer, one end of the scintillator is coupled with the photosensor, the scintillator is located between the photosensor and the X-ray beam such that the scintillator will be irradiated by the redundant beam, and the shielding layer is arranged on the periphery of the photosensor.

Further, the intensity detecting module is a gas detecting module, the gas detecting module includes a high-voltage plate electrode, a collection plate electrode and a working gas, the high-voltage plate electrode is located between the X-ray emitting device and the collection plate electrode and is perpendicular to the incidence direction of the X-ray beam such that the high-voltage plate electrode will be irradiated by the redundant beam, and the working gas is located between the high-voltage plate electrode and the collection plate electrode.

According to the X-ray inspection system provided by the third aspect of the present invention, the X-ray beam intensity monitoring device includes the intensity detecting module and the data processing module, the intensity detecting module is arranged between the emitting device and the detector array to be irradiated by the redundant beam and send the detecting signal, and the data processing module is coupled with the intensity detecting module to receive the detecting signal and output the X-ray beam intensity monitoring signal. The intensity detecting module of the X-ray inspection system adopts the redundant beam of the X-ray beam, and the intensity detecting module is basically free from the influence of the X-ray emitting device and the inspected object, so that the monitoring result of the X-ray beam intensity can be more accurate and reliable. Further, since the intensity detecting module has no influence on the working beam, thereby having no influence on the intensity of the working beam arriving at the inspected object and the detector array.

Through a detailed description on exemplary embodiments of the present invention with reference to accompanying drawings below, other features and advantages of the present invention will be clear.

BRIEF DESCRIPTION OF THE DRAWINGS

The accompanying drawings illustrated herein are used for providing further understanding of the present invention and constitute a part of the present application, and the exemplary embodiments of the present invention and the illustration thereof are used for explaining the present invention, rather than constituting improper limitations to the present invention. In the accompanying drawings.

In FIG. 1 to FIG. 7, marks in the accompanying drawings are respectively as follows:

1 represents an electron accelerator;
2 represents a detector array;
3 represents a collimator;
4 represents an inspected object;
5 represents a scintillation detecting module;
51 represents a scintillator;
52 represents a photosensor;
53 represents a shielding layer;
6 represents a gas detecting module;
61 represents a high-voltage plate electrode;
62 represents a collection plate electrode;
63 represents a working gas.

DETAILED DESCRIPTION OF THE EMBODIMENTS

A clear and complete description of technical solutions in the embodiments of the present invention will be given below, in combination with the accompanying drawings in the embodiments of the present invention. Apparently, the embodiments described below are merely a part, but not all, of the embodiments of the present invention. A description on at least one exemplary embodiment below is actually only illustrative, and cannot be used as any limitation to the present invention or the application or the use thereof. All of the other embodiments, obtained by those of ordinary skill in the art based on the embodiments of the present invention without any creative effort, fall into the protection scope of the present invention.

Unless otherwise specified, relative arrangement of components and steps, numeric expressions and numerical values described in these embodiments generate no limitation to the scope of the present invention. Meanwhile, it should be understood that, for the convenience of description, the sizes of various components shown in the accompanying drawings are not drawn according to an actual proportional relationship. The technology, methods and equipment known to those of ordinary skill in the relevant art may not be discussed in detail, but the technology, the methods and the equipment should be deemed to be a part of the authorized specification under appropriate circumstances. In all the examples shown and discussed herein, any particular value should be interpreted as being merely an example, not a restriction. Thus, other examples of the exemplary embodiments can have different values. It should be noted that, similar marks and letters represent similar items in the following accompanying drawings, so that once a certain item is defined in an accompanying drawing, the item does not need to be further discussed in the subsequent accompanying drawings.

Embodiment 1

FIG. 1 to FIG. 5 show an X-ray inspection system in the first embodiment of the present invention.

Figure 1:
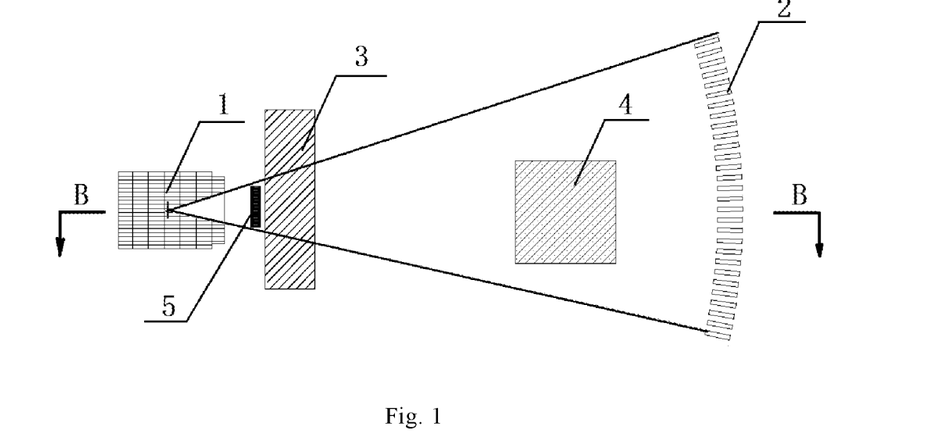
FIG. 1 is a layout schematic diagram of an X-ray inspection system in the first embodiment of the present invention.
Figure 2:
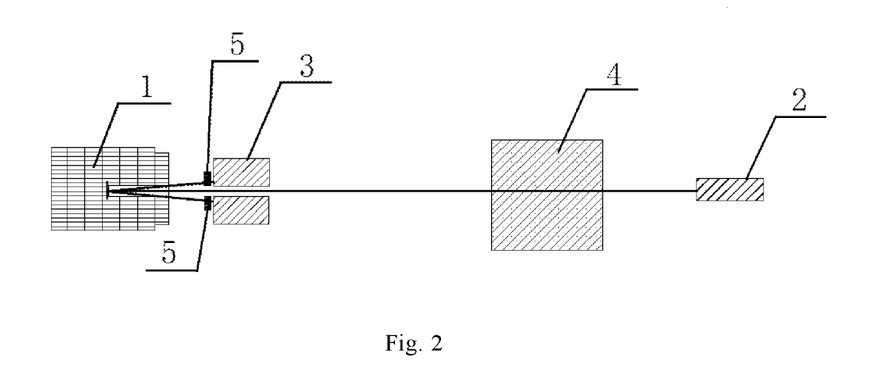
FIG. 2 is a sectional schematic diagram of a B-B direction of the X-ray inspection system as shown in FIG. 1.

FIG. 1 is a layout schematic diagram of an X-ray inspection system in the first embodiment of the present invention. FIG. 2 is a sectional schematic diagram of a B-B direction of the X-ray inspection system as shown in FIG. 1. As shown in FIG. 1 and FIG. 2, the X-ray inspection system in the first embodiment includes an X-ray emitting device adopted to emit X-rays, a collimator 3, a detector array 2 used in X-ray inspection and an X-ray beam intensity monitoring device.

Further, the X-ray beam intensity monitoring device is adopted to monitor the X-ray beam intensity of the X-ray emitting device. The X-ray beam intensity monitoring device includes an intensity detecting module and a data processing module. The data processing module is coupled with the intensity detecting module to receive the detecting signal sent by the intensity detecting module and output an X-ray beam intensity monitoring signal.

The X-ray beam intensity monitoring signal includes a dose monitoring signal for the X-ray beam and a brightness correction signal for correcting signal values of the detector array. The X-ray beam intensity monitoring device can simultaneously perform dose monitoring and brightness monitoring, thereby improving the service efficiency of the X-ray beam intensity monitoring device.

An X-ray beam emitted by the X-ray emitting device includes a working beam irradiated on the detector array 2 and a redundant beam irradiated on the outside of the detector array 2. The intensity detecting module of the X-ray beam intensity monitoring device is preferably arranged between the emitting device and the detector array 2 such that the intensity detecting module will be irradiated by the redundant beam and send a detecting signal.

The intensity detecting module of the X-ray inspection system adopts the redundant beam of the X-ray beam, and the intensity detecting module is basically free from the influence of the X-ray emitting device and the inspected object 4, so that the monitoring result of the X-ray beam intensity can be more accurate and reliable. Further, since the intensity detecting module has no influence on the working beam, thereby having no influence on the intensity of the working beam arriving at the inspected object 4 and the detector array 2.

In the first embodiment, the X-ray emitting device is an electron accelerator 1. In other non-shown embodiments, the X-ray emitting device can be other X-ray emitting devices, such as an X-ray tube, etc.

The collimator 3 is located between the X-ray emitting device and the detector array 2. The collimator 3 is adopted to shield the redundant beam. When an inspected object 4 is inspected, the collimator 3 is located between the X-ray emitting device and the inspected object 4, and the working beam of the X-ray beam irradiates the inspected object 4 and the detector array 2 after passing through the collimator 3.

When the X-ray inspection system is provided with the collimator 3, the intensity detecting module is located between the X-ray emitting device and the collimator 3. Owing to this arrangement, the direct electromagnetic interference from the electron accelerator 1 is avoided, and meanwhile the monitoring result of the X-ray beam intensity will not be influenced by the arrangement of the collimator 3.

Preferably, the X-ray beam intensity monitoring device includes a plurality of intensity detecting modules which are symmetrically arranged relative to the working beam. By means of the plurality of intensity detecting modules which are symmetrically arranged relative to the working beam, when the X-ray beam emitted by the X-ray emitting device deflects, the detecting signals sent by the intensity detecting modules can compensate each other, so that the monitoring result of the X-ray beam intensity can be more accurate and reliable compared with that when only a single intensity detecting module is arranged. Two intensity detecting modules are specifically arranged in the first embodiment. In other non-shown embodiments, more intensity detecting modules, for example 4, can be arranged.

In the first embodiment, the working beam is a fan-shaped beam, and the intensity detecting module is located at a side of the fan-shaped beam. Owing to this arrangement, the intensity detecting module is located at a "main beam" of the X-ray beam and is closer to the central position of the X-ray beam, so that information of the X-ray beam identify can be provided more effectively.

As shown in FIG. 1 and FIG. 2, the sector of the fan-shaped beam is perpendicular to the ground, one side where the electron accelerator 1 is located is a front side, one side where the detector array 2 is located is a back side, one intensity detecting module (called a left detecting module and a right detecting module below) is respectively arranged on the left and right sides of the sector of the fan-shaped beam. Further, the left detecting module and the right detecting module are placed between the electron accelerator 1 and the collimator 3 and are adopted to generate the X-ray beam intensity monitoring signal after transmitting the obtained detecting signals to the data processing module for merging and converting.

The left detecting module and the right detecting module are symmetrically arranged on the left and right sides of the sector of the fan-shaped beam and are located at positions capable of being directly irradiated by the redundant beam, so as to monitor the X-ray beam intensity via the redundant beam. The left detecting module and the right detecting module are isolated by a certain gap, and the width of the gap is large enough to guarantee that the working beam can be irradiated within a range required by the width of the detector array 2 without being influenced.

Figure 3:
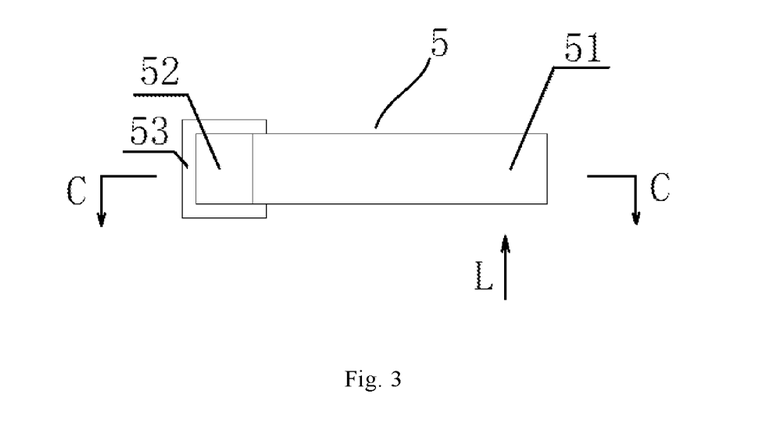
FIG. 3 is a schematic diagram of a structure principle of an intensity detecting module of an X-ray beam intensity monitoring device in the X-ray inspection system as shown in FIG. 1.
Figure 4:
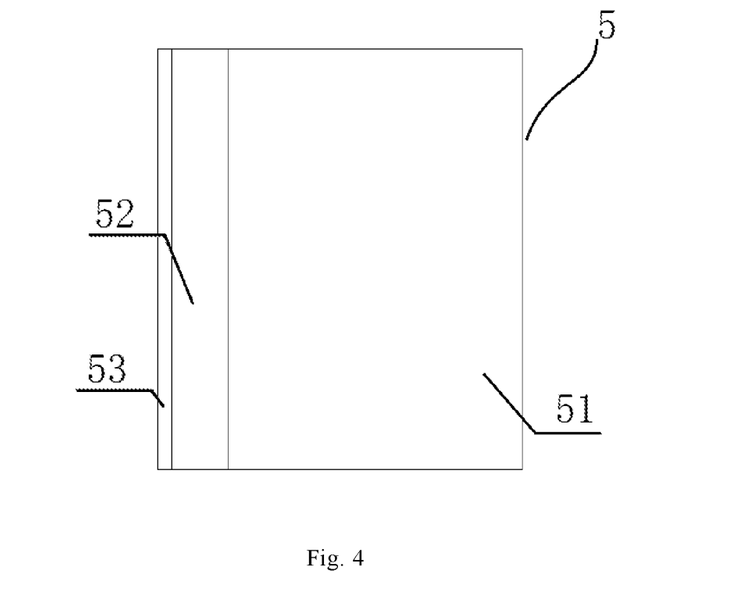
FIG. 4 is a schematic diagram of a sectional structure principle of a C-C direction of the intensity detecting module as shown in FIG. 3.

The left detecting module and the right detecting module are two detectors having symmetrical geometrical shapes and the same structure. In a direction perpendicular to the sector of the X-ray beam, when an enough sensitive size satisfies left and right deflection of the fan-shaped beam, the coverage widths of the sensitive volumes of the two detectors are still not exceeded. The intensity detecting module can have a plurality of implementation manners. FIG. 3 is a schematic diagram of a structure principle of the intensity detecting module of the X-ray beam intensity monitoring device as shown in FIG. 1. FIG. 4 is a schematic diagram of a sectional structure principle of a C-C direction of the intensity detecting module as shown in FIG. 3. FIG. 3 and FIG. 4 illustrate the working principle of the intensity detecting module in the first embodiment with one of the left detecting module and the right detecting module as an example. In FIG. 4, L represents the incidence direction of the X-ray beam.

As shown in FIG. 3 and FIG. 4, in the first embodiment, both the left detecting module and the right detecting module are scintillation detecting modules 5. Each scintillation detecting module 5 includes a scintillator 51, a photosensor 52, a shielding layer 53 and a reflecting layer (not shown). Further, one end of the scintillator 51 is coupled with the photosensor 52 and is located between the photosensor 52 and the working beam. The shielding layer 53 is arranged on the periphery of the photosensor 52 to shield the photosensor 52 from the damage of scattered X-rays. The shielding layer 53 is preferably made of a heavy metal. The reflecting layer is wrapped on a non-coupling surface on which the scintillator 51 is not coupled with the photosensor 52. The material of the reflecting layer can be titanium dioxide. In addition, a respective light sealing structure is arranged in the scintillation detecting modules 5, and the scintillator 51 and the photosensor 52 are arranged in the corresponding sealing structure which is guaranteed to donot leak light.

The scintillator 51 (i.e., a sensitive volume) of the scintillation detecting module 5 is preferably made of a scintillation crystal. The length between the scintillator 51 and the photosensor 52 is preferably large enough to guarantee that the deflection of the fan-shaped beam will not arrive at the position of the photosensor 52. The scintillator 51 is preferably perpendicular to the incidence direction L of the X-ray beam.

When the scintillation detecting module 5 detects the X-ray beam intensity, the X-rays are irradiated onto the scintillation crystal to emit twinkling light, the photosensor 52 absorbs the twinkling light to generate an electric signal, and the electric signal output by the photosensor 52 is input to the data processing module for subsequent processing.

The scintillation detecting module 5 has the advantages of large sensitive medium density and high sensitivity.

Figure 5:
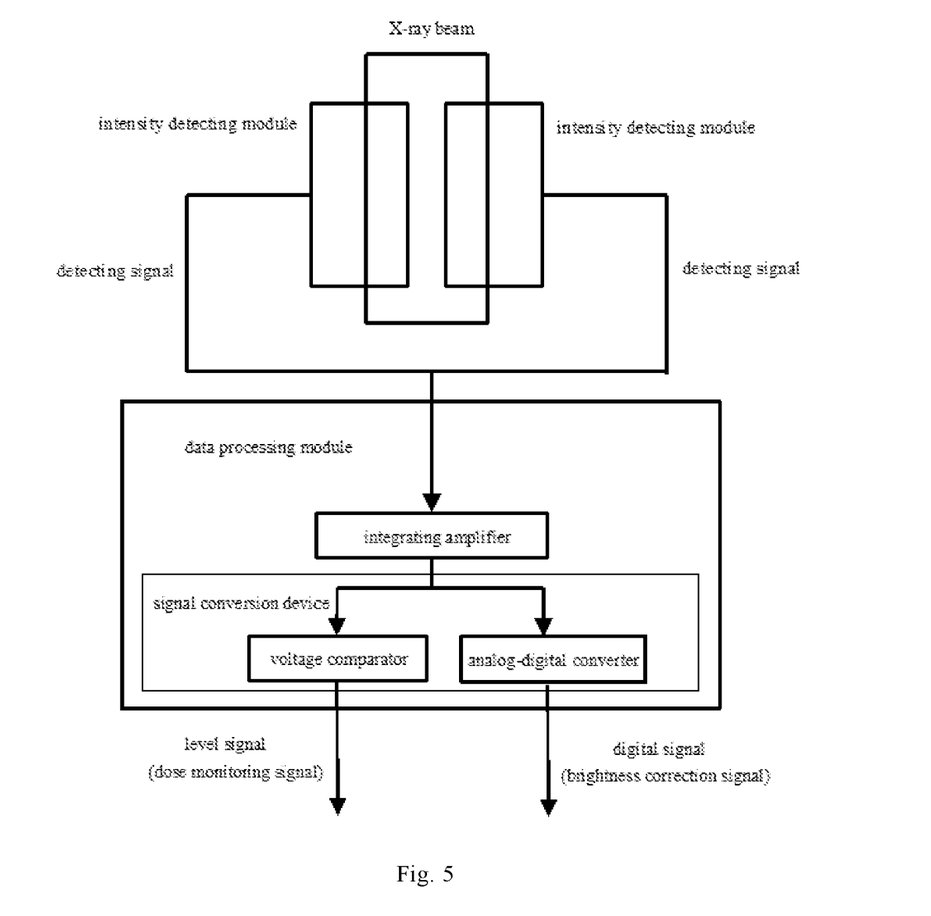
FIG. 5 is a schematic block diagram of the X-ray beam intensity monitoring device of the X-ray inspection system as shown in FIG. 1.

FIG. 5 is a schematic block diagram of the X-ray beam intensity monitoring device of the X-ray inspection system as shown in FIG. 1. As shown in FIG. 5, the data processing module is coupled with the intensity detecting modules, the detecting signals output by the intensity detecting modules are transmitted to the data processing module together, after the data processing module receives the detecting signals of the intensity detecting modules, the data processing module merges and processes the detecting signals herein and outputs the X-ray beam intensity monitoring signal.

As shown in FIG. 5, the data processing module includes an integrating amplifier and a signal conversion device.

Further, the integrating amplifier is coupled with the intensity detecting modules to receive the detecting signals sent by the intensity detecting modules and output a voltage signal. The amplitude of the voltage signal is in direct proportion to the X-ray beam intensity. The signal conversion device is coupled with the integrating amplifier to receive the voltage signal of the integrating amplifier and output the X-ray beam intensity monitoring signal.

As shown in FIG. 5, in the first embodiment, the signal conversion device specifically includes a voltage comparator and an analog-digital converter. The voltage comparator and the analog-digital converter are independently converted.

The voltage comparator is coupled with the integrating amplifier to receive the voltage signal of the integrating amplifier and output a level signal to serve as the dose monitoring signal for the X-ray beam. A reference voltage of the voltage comparator is determined according to regulated X-ray dose intensity. The dose monitoring signal is adopted to control whether to cut off the power supply of the X-ray emitting device or alarm or not.

The analog-digital converter is coupled with the integrating amplifier to receive the voltage signal of the integrating amplifier and output a digital signal to serve as the brightness correction signal for correcting signal values of the detector array.

The X-ray beam intensity monitoring device of the X-ray inspection system in the first embodiment can simultaneously perform dose monitoring and brightness monitoring, thereby improving the service efficiency of the X-ray beam intensity monitoring device. Moreover, the intensity of the working beam is not influenced by dose monitoring anymore, and the electromagnetic interference from the electron accelerator 1 is avoided. The brightness monitoring is not influenced by the inspected object 4 or the mechanical deformation of the system anymore.

Embodiment 2

Figure 6:
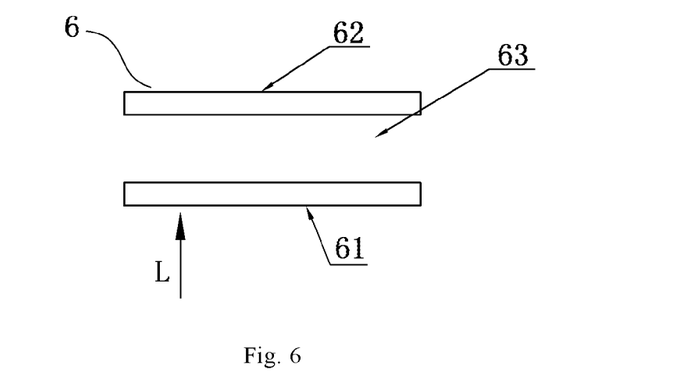
FIG. 6 is a schematic diagram of a structure principle in an overlooking direction of an intensity detecting module of an X-ray beam intensity monitoring device in an X-ray inspection system in the second embodiment of the present invention.
Figure 7:
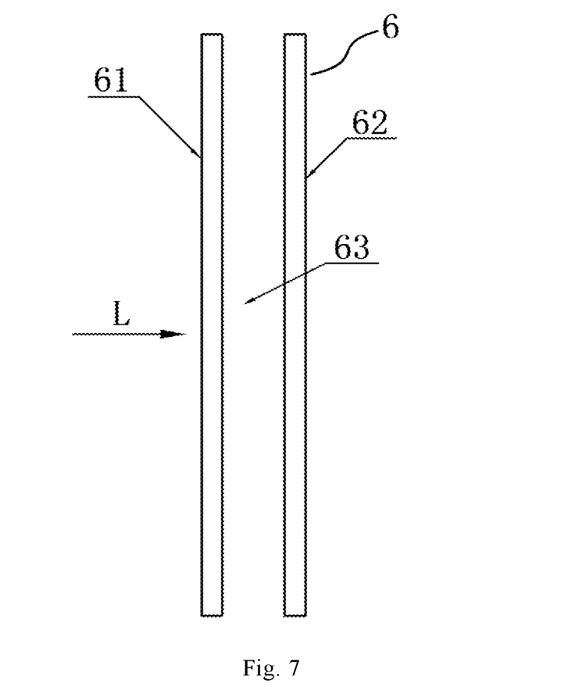
FIG. 7 is a schematic diagram of a structure principle of the intensity detecting module as shown in FIG. 6, observed in a direction perpendicular to an X-ray fan-shaped beam.

The second embodiment differs from the first embodiment as follows: in the second embodiment, the scintillation detecting module 5 in the first embodiment is replaced by a gas detecting module 6 to serve as the intensity detecting module. Further, the left detecting module and the right detecting module respectively adopt a gas detecting module 6 with the same structure to detect the intensity of the X-ray beam.

FIG. 6 is a schematic diagram of a structure principle in an overlooking direction of an intensity detecting module of an X-ray beam intensity monitoring device in an X-ray inspection system in the second embodiment of the present invention. FIG. 7 is a schematic diagram of a structure principle of the intensity detecting module as shown in FIG. 6, observed in a direction perpendicular to an X-ray fan-shaped beam. FIG. 6 and FIG. 7 illustrate the working principle of the intensity detecting module in the second embodiment with one of the left detecting module and the right detecting module as an example. In FIG. 6 and FIG. 7, L represents the incidence direction of the X-ray beam.

See FIG. 6 and FIG. 7, the gas detecting module 6 includes a gas ionization chamber. The gas ionization chamber includes two plate electrodes, which are respectively a high-voltage plate electrode 61 and a collection plate electrode 62. The two plate electrodes are perpendicular to the incidence direction L of the X-ray beam. The high-voltage plate electrode 61 is connected to high-voltage electricity and is irradiated by the redundant beam, and the collection plate electrode 62 is coupled with the data processing module. A working gas 63 is located between the high-voltage plate electrode 61 and the collection plate electrode 62. The high-voltage plate electrode 61, the collection plate electrode 62 and the working gas 63 need to be in a sealing structure.

The advantages of using the gas detecting module 6 as the intensity detecting module lie in that no irradiation damage is caused, a detection area is enlarged easily and the cost is low.

For other non-illustrated portions in the second embodiment, please refer to relevant contents in the first embodiment. The portions will not be repeated redundantly herein.

Finally, it should be noted that the above-mentioned embodiments are merely used for illustrating the technical solutions of the present invention, rather than limiting them; although the present invention has been described in detail with reference to preferred embodiments, those of ordinary skill in the art should understand that they could still make modifications to the embodiments of the present invention or make equivalent substitutions to a part of technical features; and these modifications or substitutions shall fall into the scope of the technical solutions of the present invention without departing from the spirit of the technical solutions of the present invention.

The invention claimed is:

1. An X-ray inspection system, comprising:
   an X-ray beam emitting device, a detector array and an X-ray beam intensity monitoring device, which comprises an intensity detecting module and a data processing module:
   wherein the intensity detecting module is adopted to be irradiated by the X-ray beam and send a detecting signal, the data processing module is coupled with the intensity detecting module to receive the detecting signal and output an X-ray beam intensity monitoring signal, wherein the X-ray beam intensity monitoring signal comprises a dose monitoring signal for the X-ray beam and a brightness correction signal for correcting signal values of the detector array,
   wherein the data processing module comprises an integrating amplifier and a signal conversion device, the integrating amplifier is coupled with the intensity detecting module to receive the detecting signal and output a voltage signal, and the signal conversion device is coupled with the integrating amplifier to receive the voltage signal and output the dose monitoring signal and the brightness correction signal; and
   wherein the signal conversion device comprises a voltage comparator and an analog-to-digital converter, the voltage comparator is coupled with the integrating amplifier to receive the voltage signal and output a level signal to serve as the dose monitoring signal, and the analog-to-digital converter is coupled with the integrating amplifier to receive the voltage signal and output a digital signal to serve as the brightness correction signal.

2. The X-ray inspection system of claim 1, wherein the X-ray beam intensity monitoring device comprises a plurality of intensity detecting modules, and the plurality of intensity detecting modules are coupled with the same data processing module.

3. The X-ray inspection system of claim 1, wherein an X-ray beam emitted by the X-ray beam emitting device comprises a working beam irradiated on the detector array and a redundant beam irradiated on the outside of the detector array, and the intensity detecting module of the X-ray beam intensity monitoring device is arranged between the X-ray beam emitting device and the detector array to be irradiated by the redundant beam and send the detecting signal.

4. The X-ray inspection system of claim 3, wherein the X-ray inspection system further comprises a collimator, and the intensity detecting module is located between the X-ray beam emitting device and the collimator.

5. The X-ray inspection system of claim 1, wherein the X-ray beam is a fan-shaped beam, and the intensity detecting module is located at a side of the fan-shaped beam.

6. The X-ray inspection system of claim 5, further comprising a collimator located between the X-ray beam emitting device and the detector array, wherein the intensity detecting module is located between the X-ray beam emitting device and the collimator.

7. The X-ray inspection system of claim 3, wherein the X-ray beam intensity monitoring device comprises a plurality of intensity detecting modules which are symmetrically arranged relative to the working beam.

8. The X-ray inspection system of claim 1, wherein the intensity detecting module is a scintillation detecting module, the scintillation detecting module comprises a scintillator, a photosensor and a shielding layer, one end of the scintillator is coupled with the photosensor, the scintillator is located between the photosensor and the X-ray beam such that the scintillator will be irradiated by the redundant beam, and the shielding layer is arranged on the periphery of the photosensor.

9. The X-ray inspection system of claim 1, wherein the intensity detecting module is a gas detecting module, the gas detecting module comprises a high-voltage plate electrode, a collection plate electrode and a working gas, the high-voltage plate electrode is located between the X-ray beam emitting device and the collection plate electrode and is perpendicular to the incidence direction of the X-ray beam such that the high-voltage plate electrode will be irradiated by the redundant beam, and the working gas is located between the high-voltage plate electrode and the collection plate electrode.

* * * * *